(12) United States Patent
Lee

(10) Patent No.: US 11,337,319 B2
(45) Date of Patent: May 17, 2022

(54) LATCH STRUCTURE AND DEVICE WITH THE SAME

(71) Applicant: GETAC TECHNOLOGY CORPORATION, Hsinchu County (TW)

(72) Inventor: Kun-Cheng Lee, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 249 days.

(21) Appl. No.: 16/679,045

(22) Filed: Nov. 8, 2019

(65) Prior Publication Data
US 2020/0337164 A1    Oct. 22, 2020

Related U.S. Application Data

(60) Provisional application No. 62/834,895, filed on Apr. 16, 2019.

(51) Int. Cl.
| | |
|---|---|
| *H05K 5/06* | (2006.01) |
| *H05K 5/00* | (2006.01) |
| *G06F 1/16* | (2006.01) |
| *H05K 5/02* | (2006.01) |
| *E05B 65/00* | (2006.01) |
| *H05K 5/03* | (2006.01) |
| *G06F 1/18* | (2006.01) |

(52) U.S. Cl.
CPC ......... *H05K 5/0221* (2013.01); *E05B 65/001* (2013.01); *E05B 65/0067* (2013.01); *H05K 5/0008* (2013.01); *H05K 5/03* (2013.01); *H05K 5/069* (2013.01); *G06F 1/1613* (2013.01); *G06F 1/182* (2013.01)

(58) Field of Classification Search
CPC ..... H05K 5/0008; H05K 5/061; G06F 1/1656
See application file for complete search history.

(56) References Cited

U.S. PATENT DOCUMENTS

| | | | | |
|---|---|---|---|---|
| 7,789,437 | B2* | 9/2010 | Sheng | G06F 1/1658 |
| | | | | 292/137 |
| 8,089,757 | B2* | 1/2012 | Chen | G06F 1/1656 |
| | | | | 361/679.56 |
| 8,934,224 | B2* | 1/2015 | Iwamoto | H01R 13/5213 |
| | | | | 361/679.02 |
| 9,282,659 | B2* | 3/2016 | Lee | H05K 5/0239 |
| 9,317,077 | B2* | 4/2016 | Mori | G06F 1/1679 |
| 9,529,392 | B2* | 12/2016 | Lee | G06F 1/1656 |
| 9,560,782 | B2* | 1/2017 | Lee | G06F 1/1656 |
| 9,668,370 | B1* | 5/2017 | Huang | G06F 1/1656 |
| 10,743,431 | B2* | 8/2020 | Shindo | G06F 1/1656 |
| 10,990,135 | B2* | 4/2021 | Joo | H05K 5/03 |
| 2005/0205576 | A1* | 9/2005 | Bednara | H05K 5/0221 |
| | | | | 220/328 |

(Continued)

*Primary Examiner* — Hung V Ngo

(57) ABSTRACT

A latch structure includes a moving member, a nut and a screw. The moving member includes a base plate, a receiving portion and a limiting portion. The receiving portion has a first end portion and a second end portion. The first end portion is connected to the base plate. The limiting portion is disposed at the second end portion of the receiving portion. The nut is fixed into the receiving portion and positioned proximate to the first end portion. The screw is received in the receiving portion and confined to between the limiting portion and the nut.

17 Claims, 7 Drawing Sheets

(56) References Cited

U.S. PATENT DOCUMENTS

| | | | | |
|---|---|---|---|---|
| 2014/0294216 A1* | 10/2014 | Teng | ............... | H04R 1/025 |
| | | | | 381/334 |
| 2014/0374133 A1* | 12/2014 | Rost | ............... | H05K 5/061 |
| | | | | 174/50.51 |
| 2015/0047262 A1* | 2/2015 | Lee | ............... | H05K 5/061 |
| | | | | 49/394 |
| 2015/0097471 A1* | 4/2015 | Bailey | ............... | A47B 81/00 |
| | | | | 312/100 |

* cited by examiner

LATCH STRUCTURE AND DEVICE WITH THE SAME

This application claims the benefit of U.S. Application No. 62/834,895, filed on Apr. 16, 2019, the entire disclosure of which is hereby incorporated by reference.

BACKGROUND OF THE INVENTION

Field of the Invention

The present disclosure relates to latch structures and devices with the same and, more particularly, to a latch structure capable of preventing a screw from loosening and a device with the same.

Description of the Prior Art

A computer operating in a workplace exposed to inflammable/explosible gas or fluid must be equipped with a device that meets safety and explosion prevention requirements. To preclude the possibility of ignition of gas or dust explosion in a dangerous region (for example, a place exposed to explosible gas or dust), electronic device users in the dangerous region must have the electronic devices each equipped with a waterproof door which covers a connector interface from outside.

For instance, China patent 104582346 discloses a waterproof door component of an electronic device. An annular wall is disposed at an opening of the electronic device. The waterproof door component comprises an engaging element, a waterproof latch and a switch wrenching element. The engaging element is formed on the electronic device. The waterproof latch includes a covering door and a replaceable ring. The covering door is pivotally connected to the electronic device. Two opposing surfaces of the covering door each extend to form a bump and have an engaging portion. The replaceable ring fits around the edges of the bumps. The switch wrenching element is connected to and slides relative to the covering door. The switch wrenching element has a snap-engaging portion and a buckling portion. A user slides the switch wrenching element and thereby causes the snap-engaging portion and the engaging portions to undergo multistage adjustment and positioning; hence, the buckling portion corresponds in position to the engaging element engaging, and the bumps are inserted into the opening. The replaceable ring is clamped between the annular wall and the bumps. Therefore, the waterproof latch has a good hermetic seal and a long service life.

SUMMARY OF THE INVENTION

In an embodiment of the present disclosure, a latch structure comprises a moving member, a nut and a screw. The moving member comprises a base plate, a receiving portion and a limiting portion. The receiving portion has a first end portion and a second end portion. The first end portion is connected to the base plate. The limiting portion is disposed at the second end portion of the receiving portion. The nut is fixed into the receiving portion and positioned proximate to the first end portion. The screw is received in the receiving portion and confined to between the limiting portion and the nut.

In an embodiment of the present disclosure, a device with a latch structure comprises a casing, a waterproof cover, a moving member, a nut and a screw. The moving member comprises a base plate, a receiving portion and a limiting portion. The casing is penetratedly provided with an opening. The rim of the opening has a waterproof wall. The waterproof cover is fastened to the casing and selectively covers or stays away from the opening. The moving member is movably fitted to waterproof cover. The receiving portion has a first end portion and a second end portion. The first end portion is connected to the base plate. The limiting portion is disposed at the second end portion of the receiving portion. The nut is fixed into the receiving portion and positioned proximate to the first end portion. The screw is received in the receiving portion and confined to between the limiting portion and the nut.

In an embodiment of the present disclosure, a device with a latch structure comprises a casing, a waterproof cover, a base plate, a nut and a screw. The casing is penetratedly provided with an opening. The rim of the opening has a waterproof wall. The waterproof cover selectively covers or stays away from the opening. The base plate is movably fitted to the waterproof cover. The nut is fixed to the base plate. The screw is meshed with the nut and adapted to be received in a fastening hole of the waterproof cover.

In view of this, the present disclosure provides, in an embodiment thereof, a latch structure and a device with a latch structure. Advantageous technical features of the present disclosure are briefly described below. A screw is received in a receiving portion of a moving member and confined to between a limiting portion of the moving member and a nut fixed into the receiving portion. Therefore, the screw is hidden inside the moving member and confined to the receiving portion; hence, the screw is not only prevented from protruding outward and thereby engaging with a foreign body, but is also prevented from falling off. Furthermore, the screw is prevented from loosening for human-related reasons, for example, when the device in operation is hit or falls, or external reasons. In addition, owing to the coordination between a thread segment or shank segment and a fastening hole, a user at a workplace is unable to move the moving member easily by hand, thereby preventing the waterproof cover from being opened by the user unnecessarily.

DETAILED DESCRIPTION OF THE EMBODIMENTS

Figure 1:
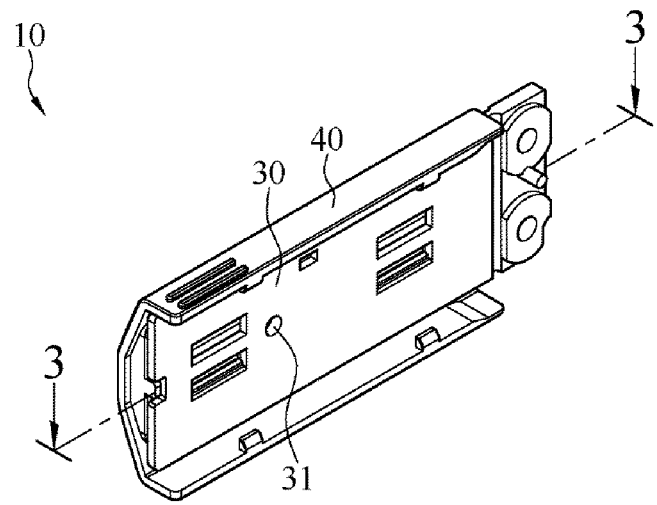
FIG. 1 is a schematic view of a latch structure fitted to a waterproof cover according to an embodiment of the present disclosure.
Figure 2:
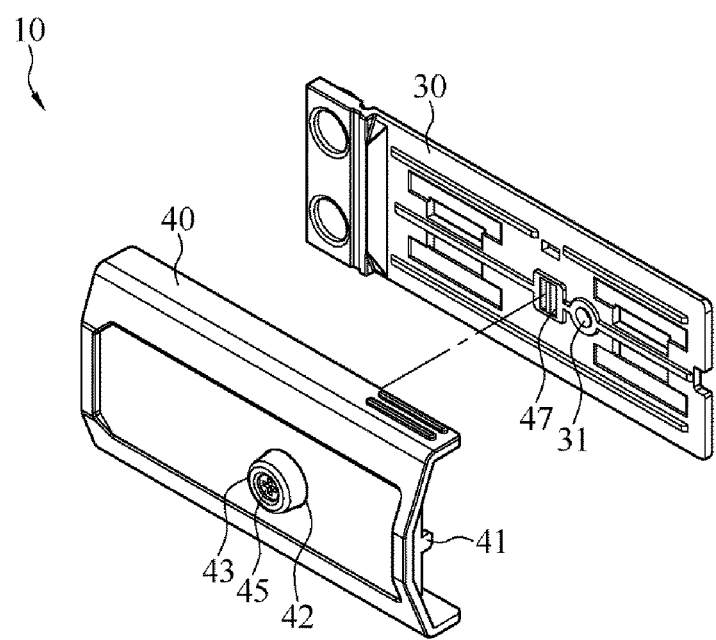
FIG. 2 is an exploded view of the latch structure and the waterproof cover according to an embodiment of the present disclosure.
Figure 3:
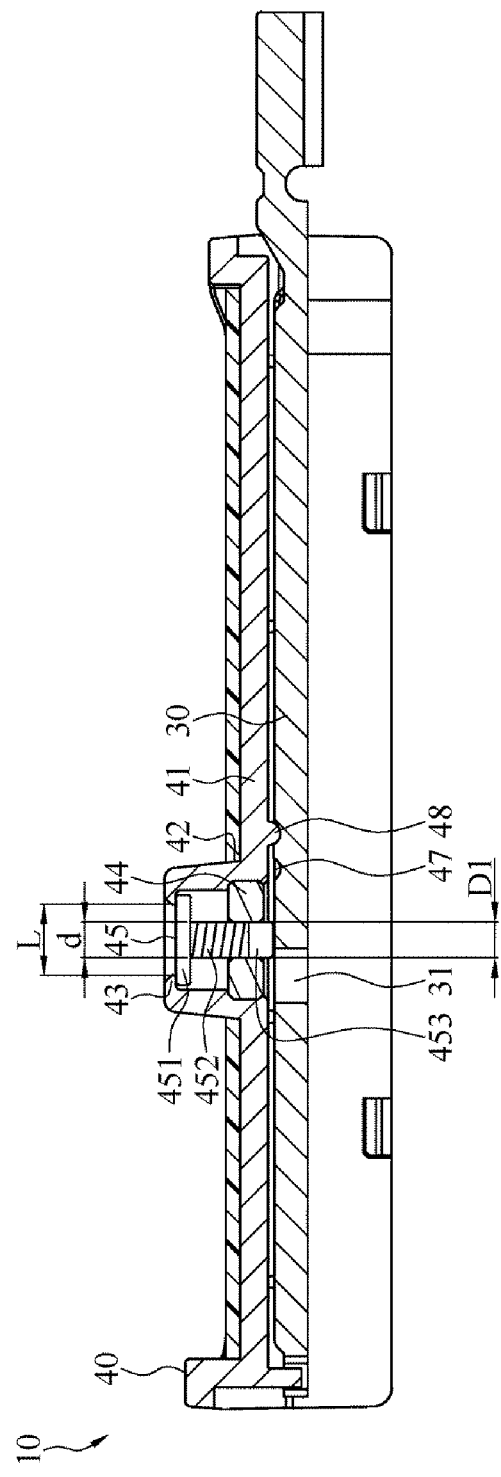
FIG. 3 is a cross-sectional view of the latch structure fitted to the waterproof cover according to an embodiment of the present disclosure.

Refer to FIG. 1 through FIG. 3. FIG. 1 is a schematic view of a latch structure fitted to a waterproof cover according to an embodiment of the present disclosure. FIG. 2 is an exploded view of the latch structure and the waterproof cover according to an embodiment of the present disclosure. FIG. 3 is a cross-sectional view of the latch structure fitted to the waterproof cover according to an embodiment of the present disclosure. FIG. 1 through FIG. 3 are intended to illustrate a latch structure 10 and a waterproof cover 30 and therefore only schematically show structural components required by the latch structure 10 to attain fastening and structural components required to fit the waterproof cover 30 to the latch structure 10. In this embodiment, the latch structure 10 comprises a moving member 40, a nut 44 and a screw 45. The moving member 40 comprises a base plate 41, a receiving portion 42 and a limiting portion 43. The receiving portion 42 has a first end portion and a second end portion. In this embodiment, the waterproof cover 30 comprises a fastening hole 31 and two positioning grooves 47, as shown in FIG. 2.

Figure 4:
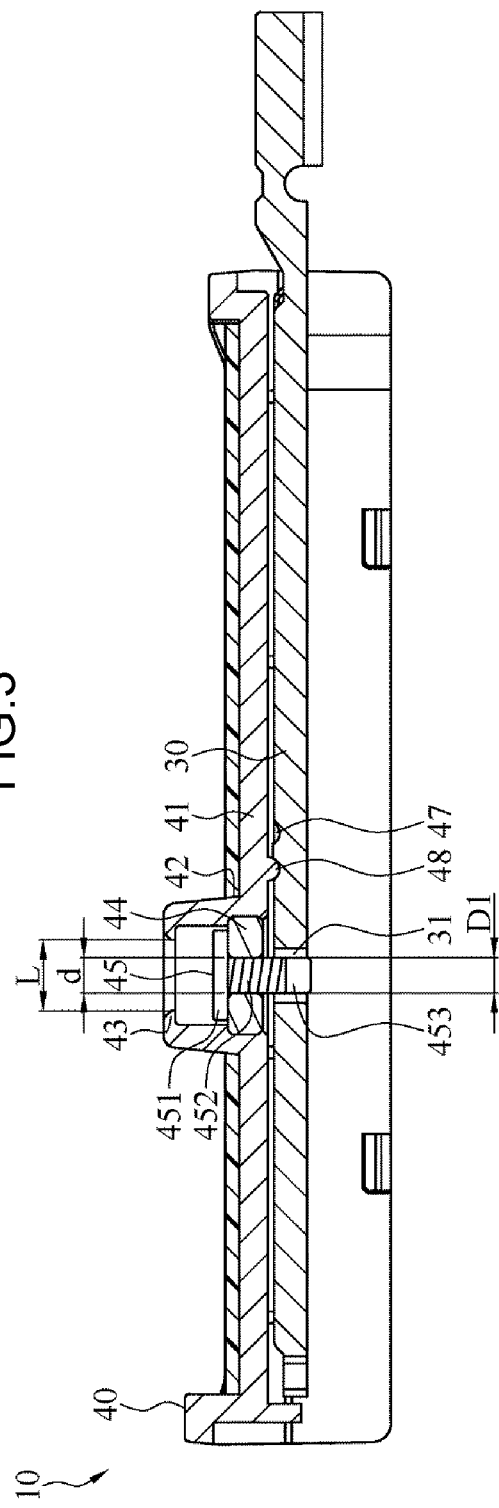
FIG. 4 is a cross-sectional view of the latch structure fitted to the waterproof cover according to another embodiment of the present disclosure.
Figure 5:
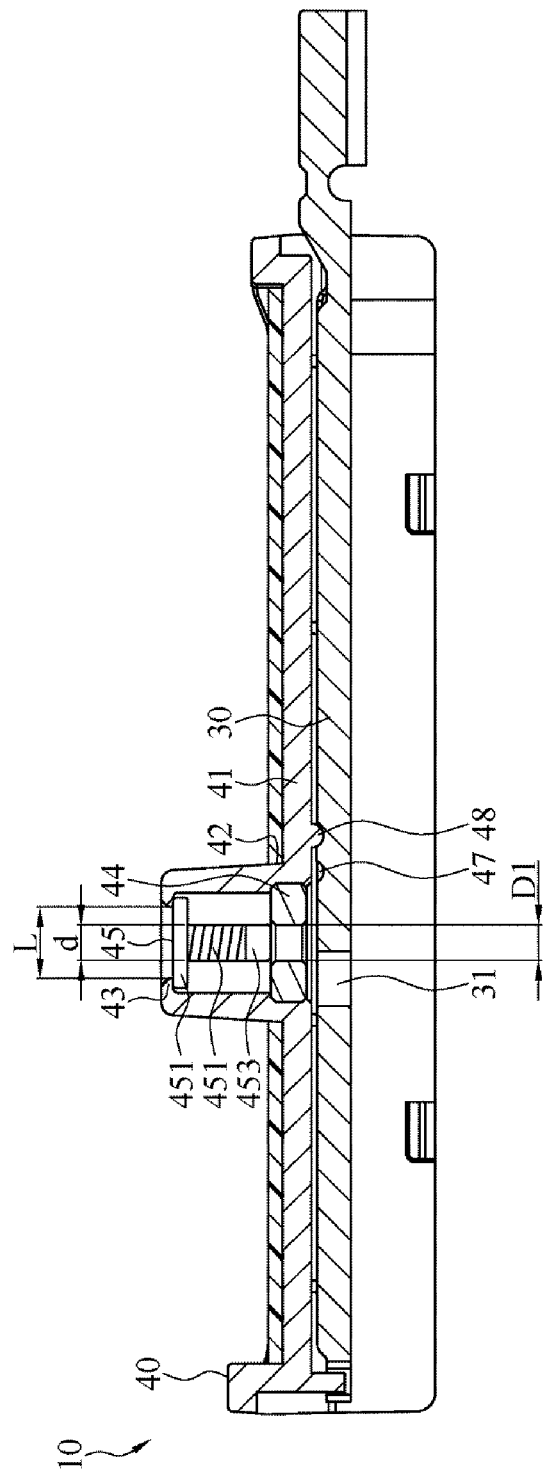
FIG. 5 is a cross-sectional view of the latch structure fitted to the waterproof cover according to yet another embodiment of the present disclosure.

Referring to FIG. 3 through FIG. 5, in this embodiment, the first end portion of the receiving portion 42 is connected to the base plate 41, whereas the nut 44 is fixed in place in the receiving portion 42 and positioned proximate to the first end portion. The screw 45 is received in the receiving portion 42 and confined to between the limiting portion 43 and the nut 44. In this embodiment, the screw 45 has a head 451, a thread segment 452 and a shank segment 453. The thread segment 452 is disposed between the head 451 and the shank segment 453. The outer thread of the thread segment 452 is adapted to mesh with the inner thread of the nut 44. The inner thread of the nut 44 has a minor diameter D1. The diameter (or a dimension) of the head 451 of the screw 45 is greater than the minor diameter D1. When the head 451 is rotated to move downward to reach the nut 44, the nut 44 stops the screw 45 which would otherwise continue to be rotated and moved downward, and in consequence the screw 45 is neither exposed nor falls out of the nut 44. At this point, the thread segment 452 and the shank segment 453 are partially received in the fastening hole 31 (shown in FIG. 4). Hence, the inner diameter (or a dimension) of the fastening hole 31 is greater than a major diameter d of the thread segment 452, whereas the inner diameter (or a dimension) of the fastening hole 31 is greater than the outer diameter (or a dimension) of the shank segment 453. The limiting portion 43 has an inner diameter L. The diameter (a dimension) of the head 451 of the screw 45 is greater than the inner diameter L. When the head 451 is rotated to move upward to reach the limiting portion 43, not only has the thread segment 452 not yet separated from the nut 44, but the limiting portion 43 also stops the screw 45 which would otherwise continue to be rotated and moved upward; hence, the screw 45 is neither exposed nor falls out of the receiving portion 42 (shown in FIG. 3). However, in a variant embodiment, the screw 45 can be rotated to move upward until it separates from the nut 44, such that the thread segment 452 separates from the nut 44, so as to prevent the screw 45 from continuing with its rotation and resultant upward movement which might otherwise occur because of relative movement of the thread segment 452 and the nut 44 to each other. Furthermore, the limiting portion 43 stops the screw 45, and in consequence the screw 45 is prevented from protruding outward, exposing itself or falling out of the receiving portion 42 (shown in FIG. 5). In a variant embodiment, the screw 45 has a head 451 and a thread segment 452 only but dispenses with a shank segment 453, wherein the fastening hole 31 receives part of the thread segment 452.

Therefore, the screw 45 is hidden inside the moving member 40 and confined to the receiving portion 42. The screw 45 is unlikely to protrude outward and bump into a foreign body, thereby preventing the screw 45 from falling off. The screw 45 is prevented from loosening for human-related reasons, for example, when the device 100 in operation is hit or falls, or external reasons.

In a variant embodiment, the receiving portion 42 is hollow-cored, for example, hollow-cored and post-shaped, or hollow-cored and cylindrical, and therefore receives the screw 45. In a variant embodiment, the limiting portion 43 is ring-shaped, and the diameter of the head 451 of the screw 45 is greater than the ring-shaped inner diameter L of the limiting portion 43.

The shank segment 453 of the screw 45 of the latch structure 10 is adapted to be received in the fastening hole 31 of the waterproof cover 30. As shown in FIG. 1 and FIG. 2, the latch structure 10 is fitted to the waterproof cover 30, wherein the waterproof cover 30 has the fastening hole 31 and two positioning grooves 47. The positioning grooves 47 are each positioned proximate to the fastening hole 31. In a variant embodiment, the waterproof cover 30 is fastened to a casing 20 (of any device) which has to be fastened in place and prevented from being inadvertently opened by hand or as a result of a collision. The device is, but is not limited to, an electronic device, such as a laptop, a smartphone, and a tablet.

Referring to FIG. 3 and FIG. 4, the latch structure 10 further comprises a bump 48 disposed on the lower surface of the base plate 41. The bump 48 corresponds in position to the two positioning grooves 47 on the waterproof cover 30. The bump 48 selectively moves to one of the two positioning grooves 47. In this embodiment, when the moving member 40 moves and becomes positioned because of the bump 48 and the two positioning grooves 47, the bump 48 moves from one said positioning groove 47 positioned distal to the fastening hole 31 to the other positioning groove 47 positioned proximate to the fastening hole 31, and the screw 45 also moves and stays above the fastening hole 31. After that, the user tightens the screw 45 such that the shank segment 453 of the screw 45 is received in the fastening hole 31, as shown in FIG. 4.

The male thread of the screw 45 corresponds in position to the inner thread of the nut 44. Therefore, even if the screw 45 is rotated to get closer to the limiting portion 43 as much as possible, the screw 45 will still be steadily confined to the receiving portion 42 and thereby will not shake or loosen.

Figure 6:
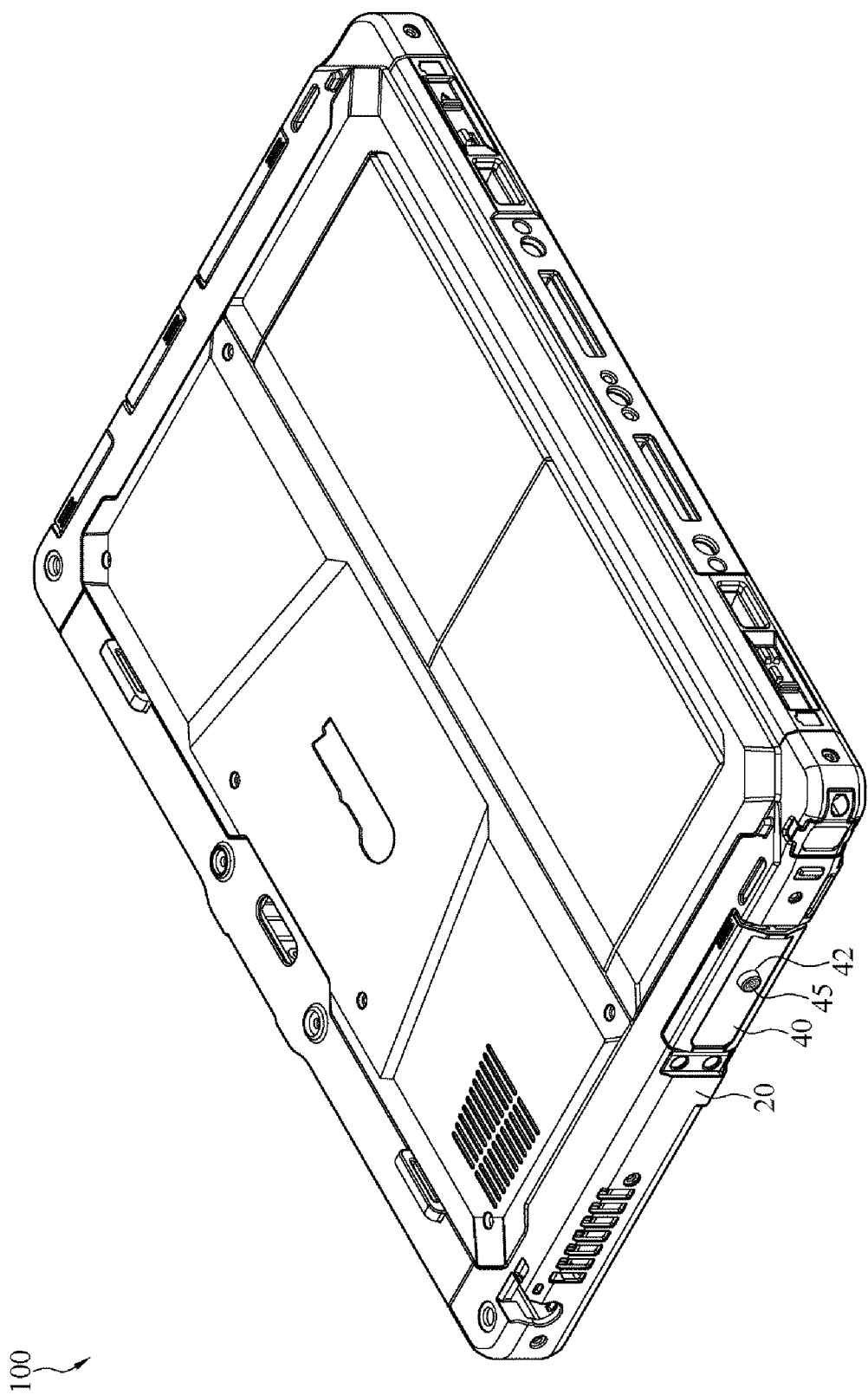
FIG. 6 is a schematic view of a device with a latch structure, with a moving member fitted to the waterproof cover, according to an embodiment of the present disclosure.
Figure 7:
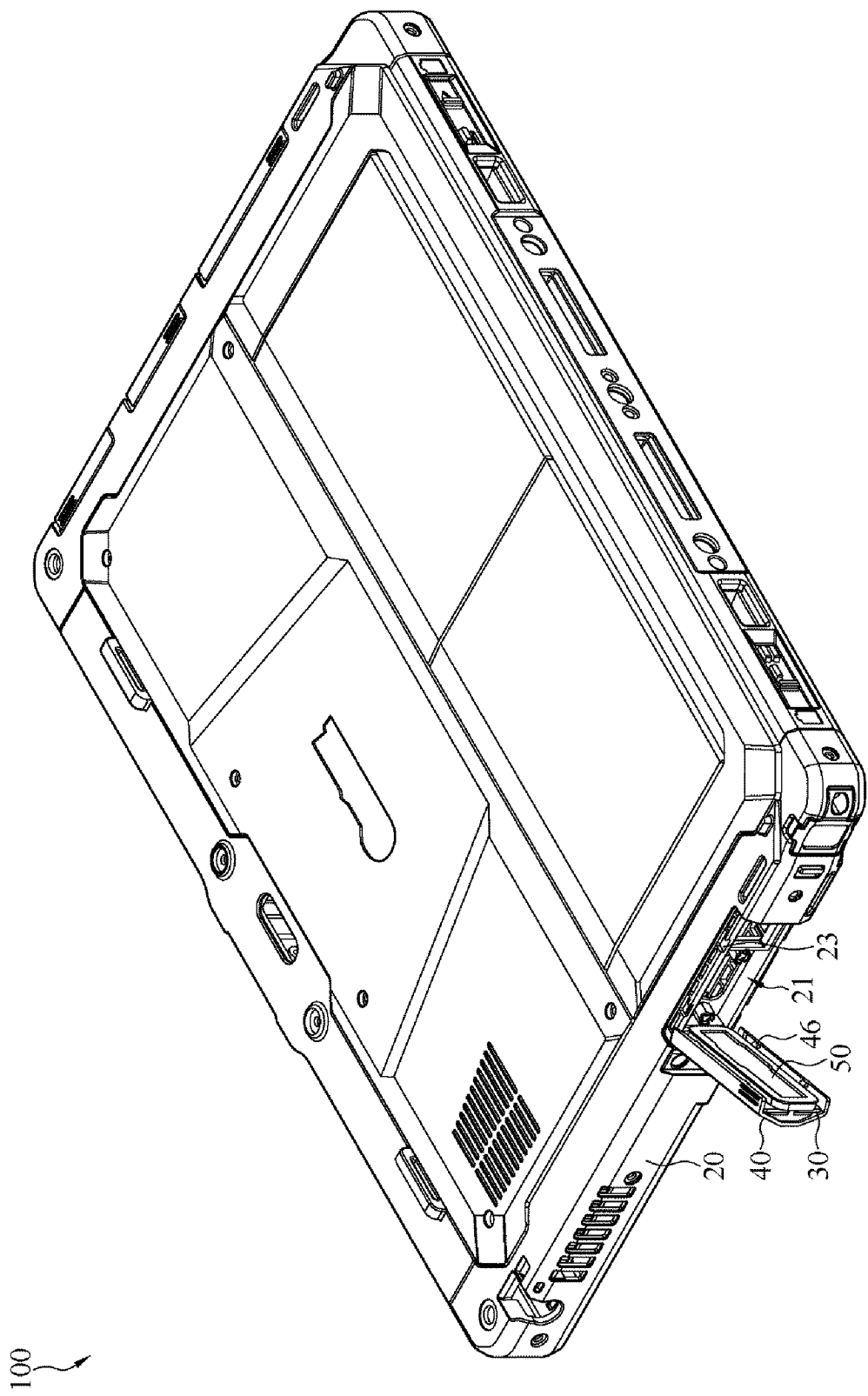
FIG. 7 is a schematic view of the device with a latch structure, with the moving member separated from the waterproof cover, according to an embodiment of the present disclosure.
Figure 8:
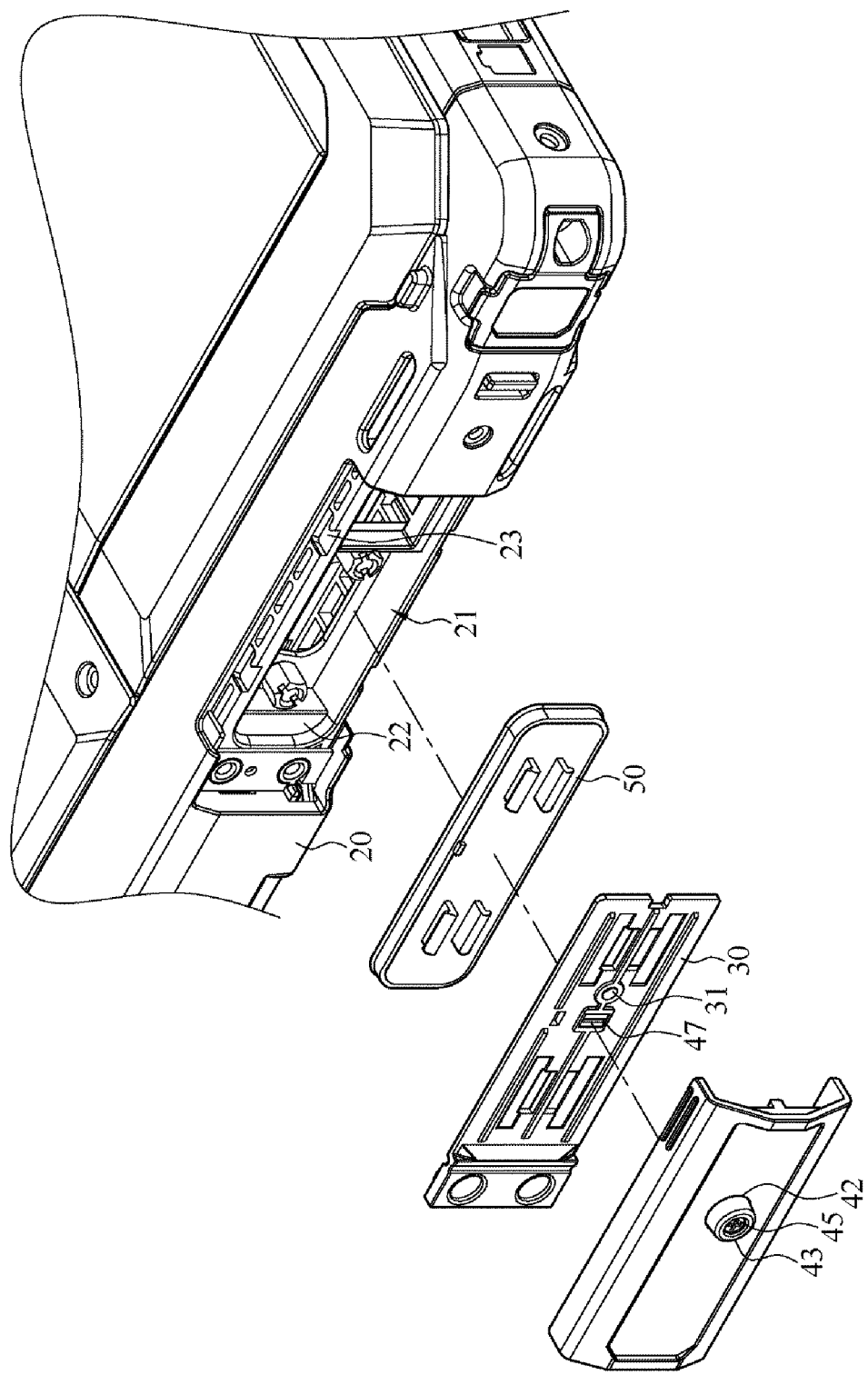
FIG. 8 is an exploded view of the latch structure according to an embodiment of the present disclosure.
Figure 9:
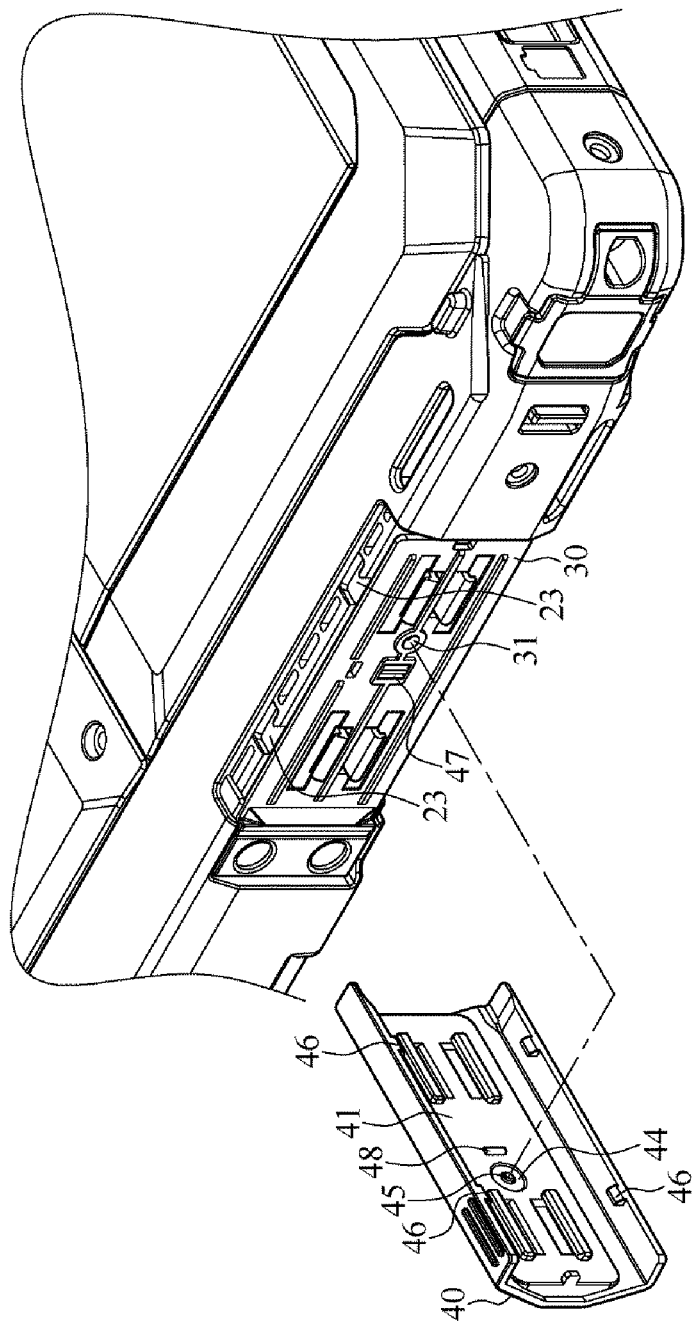
FIG. 9 is an exploded view of the latch structure, with the moving member separated, according to an embodiment of the present disclosure.

Refer to FIG. 6 through FIG. 9. FIG. 6 is a schematic view of a device with a latch structure, with a moving member fitted to the waterproof cover, according to an embodiment of the present disclosure. FIG. 7 is a schematic view of the device with a latch structure, with the moving member separated from the waterproof cover, according to an embodiment of the present disclosure. FIG. 8 is an exploded view of the latch structure according to an embodiment of the present disclosure. FIG. 9 is an exploded view of the latch structure, with the moving member separated, according to an embodiment of the present disclosure. In this embodiment, the device with a latch structure comprises the casing 20, the waterproof cover 30, the moving member 40, the nut 44 and the screw 45. The moving member 40 comprises the base plate 41, the receiving portion 42 and the limiting portion 43. The moving member 40 is movably fitted to the waterproof cover 30. In a variant embodiment, the device with a latch structure comprises the casing 20, the waterproof cover 30, the base plate 41, the nut 44 and the screw 45. In another variant embodiment, the device with a latch structure further comprises the receiving portion 42 integrally formed at the base plate 41 and adapted to receive the screw 45. In yet another variant embodiment, the device with a latch structure further comprises a limiting portion 43 integrally formed at the receiving portion 42 and adapted to stop the screw 45.

For instance, the device with a latch structure is, but is not limited to, an electronic device, such as a laptop, a smartphone, and a tablet. The opening 21 either fixes a connector interface in place or engages with an opening of another object.

Referring to FIG. 7, in this embodiment, the casing 20 of the device with the latch structure 10 is penetratedly provided with an opening 21. The rim of the opening 21 has a waterproof wall 22 which surrounds the opening 21. The waterproof cover 30 is fastened to the casing 20 and selectively covers or stays away from the opening 21. In a variant embodiment, an end portion of the waterproof cover 30 is fixed to the casing 20 by means of adhesion, engagement or fastening. For instance, FIG. 6 shows the covered state. By contrast, FIG. 7 shows that one end of the waterproof cover 30 is fixed to the casing 20, and then it is used as a fulcrum whereby the other end portion of the waterproof cover 30 is positioned distal to the opening 21, i.e., the opened state.

In this embodiment, the top of the waterproof wall 22 extends to form two engaging walls 23. The two engaging walls 23 correspond in position to two inner hooks 46 (shown in FIG. 9) disposed on a sidewall of the moving member 40. Therefore, the moving member 40 selectively moves, so as to cause each of the inner hooks 46 to engage with one said engaging wall 23 or cause each of the inner hooks 46 to stay away from the engaging walls 23 from therebetween. For instance, after the moving member 40 has moved rightward to such an extent as to allow the inner hooks 46 to engage with the engaging walls 23, the front, right points of the engaging walls 23 are confronted with a stop (shown in FIG. 8), so as to prevent separation of the inner hooks 46 from the engaging walls 23. Furthermore, the moving member 40 engages with the casing 20 to not only prevent the latch structure 10 from opening when hit, but also enhance the integrity of the appearance of the device.

Referring to FIG. 8, in a variant embodiment, a device 100 with the latch structure 10 further comprises a hermetically sealing element 50. The hermetically sealing element 50 is fitted to the waterproof cover 30 and moves together therewith, thereby allowing the hermetically sealing element 50 to cover or stay away from the opening 21. When the waterproof cover 30 covers the opening 21 of the casing 20, the hermetically sealing element 50 is in tight contact with the waterproof wall 22. For instance, both the moving member 40 and the hermetically sealing element 50 are fitted to the waterproof cover 30 and move together with the waterproof cover 30, as shown in FIG. 8 and FIG. 9. In a variant embodiment, the hermetically sealing element 50 comprises a plurality of snap-engagement components. The snap-engagement components correspond in position to the opening on the waterproof cover 30 and demountably fit the hermetically sealing element 50 to the waterproof cover 30. When the hermetically sealing element 50 is in tight contact with the waterproof wall 22, the hermetically sealing element 50 is tightly fitted to the waterproof wall 22 to achieve waterproofing.

Referring to FIG. 9, the waterproof cover 30 comprises the fastening hole 31 and two positioning grooves 47. Both the two positioning grooves 47 are positioned proximate to the fastening hole 31. The moving member 40 is movably fitted to the waterproof cover 30. The base plate 41 comprises a bump 48. The bump 48 selectively moves to one of the two positioning grooves 47 on the waterproof cover 30, so as to generate a tactile sense of snap-engagement. Therefore, with the bump 48 being able to correspond in position to the two positioning grooves 47, the moving member 40 moves relative to the waterproof cover 30 by a fixed distance. The fixed distance is the distance between the two positioning grooves 47. In this embodiment, the fixed distance enables the screw 45 to move and stay above the fastening hole 31 of the waterproof cover 30.

In a variant embodiment, after the moving member 40 has been fitted to the casing 20, the moving member 40 can slide relative to the waterproof cover 30, and in consequence the bump 48 moves from one of the positioning grooves 47 to the other positioning groove 47, by exiting one of the positioning grooves 47, then moving toward the other positioning groove 47, and finally entering the other positioning groove 47, so as to generate a tactile sense of snap-engagement.

The screw 45 is received in the receiving portion 42 and confined to between the limiting portion 43 and the nut 44. In this embodiment, the receiving portion 42 has a first end portion and a second end portion. The first end portion is connected to the base plate 41. The limiting portion 43 is disposed at the second end portion of the receiving portion 42. The nut 44 is fixed into the receiving portion 42 and positioned proximate to the first end portion. The screw 45 is embedded and hidden to achieve two advantages: first, the screw 45 being loosened or tightened is unlikely to protrude outward and bump into a foreign body, thereby preventing the screw 45 from falling off; second, the screw 45 is prevented from loosening for human-related reasons, for example, when the device 100 with the latch structure 10 in operation is hit or falls, or external reasons.

In this embodiment, after the moving member 40 has moved to such an extent as to position the screw 45 above the fastening hole 31 and tighten the screw 45, one end of the screw 45 is received in and engaged with the fastening hole 31 such that the moving member 40 is prevented from further moving laterally and thereby moving to the inner hooks 46 to thereby separate from the engaging walls 23. Hence, the user is prevented from opening the latch structure 10 by hand inadvertently.

Referring to FIG. 6, after the moving member 40 has fitted to the casing 20 and the inner hooks 46 have engaged with the engaging walls 23 formed as a result of the extension of the waterproof wall 22, one end portion of the screw 45 hidden in the receiving portion 42 of the latch structure 10 is rotated and thereby enters the fastening hole 31 of the waterproof cover 30, so as to prevent separation of the inner hooks 46 from the engaging walls 23. Therefore, if the user carries the electronic device to a dangerous region (for example, a place exposed to explosible gas or dust), the user cannot open the waterproof cover 30 by hand in the absence of any tool whereby one end portion of the screw 45 is otherwise rotated and thereby exits the fastening hole 31. Therefore, an electric appliance connector disposed in the opening 21 is unlikely to be exposed to the dangerous region because of a hit or by accident to therefore end up with an electricity leak which might otherwise come into contact with explosible gas or dust, leading to an explosion or a flash explosion.

In conclusion, the present disclosure provides the latch structure 10 and the device 100 with the latch structure 10. Therefore, the present disclosure not only prevents the screw 45 from falling off the device 100 because of a hit, a fall or engagement with a foreign body, but also prevents the user from opening the latch structure 10 by hand, which might otherwise expose an object (such as electric appliance connector) lying beneath the waterproof cover 30 to an external environment (such as an environment susceptible to inflammability or explosions) and therefore cause an accident.

Although the present disclosure is disclosed above by embodiments, the embodiments are not restrictive of the present disclosure. Changes and modifications made by persons skilled in the art to the embodiments without departing from the spirit and scope of the present disclosure must be deemed falling within the scope of the present disclosure. Accordingly, the legal protection for the present disclosure should be defined by the appended claims.

What is claimed is:

1. A latch structure, comprising:
   a moving member, comprising:
   a base plate;
   a receiving portion having a first end portion and a second end portion, the first end portion being connected to the base plate; and
   a limiting portion disposed at the second end portion of the receiving portion;
   a nut fixed into the receiving portion and positioned proximate to the first end portion; and
   a screw received in the receiving portion and confined to between the limiting portion and the nut.

2. The latch structure of claim 1, wherein the limiting portion has an inner diameter, and a head diameter of the screw is greater than the inner diameter of the limiting portion.

3. The latch structure of claim 1, wherein the screw has a thread segment and a shank segment, and an outer thread of the thread segment is adapted to mesh with an inner thread of the nut.

4. The latch structure of claim 3, wherein the shank segment is adapted to be received in a fastening hole of a waterproof cover.

5. The latch structure of claim 1, wherein the base plate is movably fitted to a waterproof cover fastened to a casing, and the waterproof cover has a fastening hole which the moving member is positioned proximate to.

6. The latch structure of claim 5, further comprising:
   two positioning grooves disposed on the waterproof cover and positioned proximate to the fastening hole; and
   a bump disposed on the base plate and selectively movable to one of the two positioning grooves.

7. The latch structure of claim 5, wherein an end of the screw is received in the fastening hole after the moving member has moved to such an extent as to allow the screw to stay above the fastening hole and allow the screw to be tightened.

8. A device with a latch structure, comprising:
   a casing penetratedly provided with an opening, wherein a rim of the opening has a waterproof wall;
   a waterproof cover fastened to the casing to selectively cover or expose the opening;
   a moving member movably fitted to the waterproof cover, comprising:
   a base plate;
   a receiving portion having a first end portion and a second end portion, the first end portion being connected to the base plate; and
   a limiting portion disposed at the second end portion of the receiving portion;
   a nut fixed into the receiving portion and positioned proximate to the first end portion; and
   a screw received in the receiving portion and confined to between the limiting portion and the nut.

9. The device with a latch structure according to claim 8, wherein a hermetically sealing element is fitted to the waterproof cover and moves together therewith, thereby allowing the hermetically sealing element to cover or stay away from the opening, and the hermetically sealing element is in tight contact with the waterproof wall.

10. The device with a latch structure according to claim 8, wherein a limiting portion has an inner diameter, and a head diameter of the screw is greater than the inner diameter of the limiting portion.

11. The device with a latch structure according to claim 8, wherein the waterproof wall extends to form two engaging walls, two inner hooks are disposed on a sidewall of the moving member, the moving member selectively moves, so as to cause each of the inner hooks to engage with one said engaging wall or cause each of the inner hooks to stay away from the engaging walls from therebetween.

12. The device with a latch structure according to claim 8, wherein the screw has a thread segment and a shank segment, and an outer thread of the thread segment meshes with an inner thread of the nut.

13. The device with a latch structure according to claim 12, wherein the shank segment is adapted to be received in a fastening hole of the waterproof cover.

14. The device with a latch structure according to claim 8, wherein the waterproof cover comprises a fastening hole and two positioning grooves positioned proximate to the fastening hole.

15. The device with a latch structure according to claim 14, wherein an end of the screw is received in the fastening hole after the moving member has moved to such an extent as to allow the screw to stay above the fastening hole and allow the screw to be tightened.

16. The device with a latch structure according to claim 14, wherein the base plate comprises a bump selectively movable to one of the two positioning grooves.

17. A device with a latch structure, comprising:
   a casing penetratedly provided with an opening, wherein a rim of the opening has a waterproof wall;
   a waterproof cover fastened to the casing and movable to selectively cover or expose the opening;
   a base plate movably fitted to the waterproof cover;
   a nut fixed to the base plate;
   a screw screwed into the nut and adapted to be received in a fastening hole of the waterproof cover;
   a receiving portion integrally formed at the base plate and adapted to receive the screw and
   a limiting portion integrally formed at the receiving portion and adapted to stop the screw.

* * * * *